United States Patent [19]

Ohtsuka et al.

[11] Patent Number: 6,158,596
[45] Date of Patent: Dec. 12, 2000

[54] SUBSTRATE HOLDER, AND SYSTEM AND METHOD FOR CLEANING AND DRYING SAME

[75] Inventors: Hiromi Ohtsuka, Kurume; Kazuhisa Matsumoto, Tosu, both of Japan

[73] Assignee: Tokyo Electron Limited, Japan

[21] Appl. No.: 09/252,036

[22] Filed: Feb. 18, 1999

[30] Foreign Application Priority Data

Feb. 24, 1998 [JP] Japan ..................................... 10-58921

[51] Int. Cl.$^7$ ........................................................ A47F 7/00
[52] U.S. Cl. .......................... 211/41.18; 206/454; 134/30; 118/500
[58] Field of Search .......................... 211/41.18; 206/454; 118/500; 134/30

[56] References Cited

U.S. PATENT DOCUMENTS

| 5,033,406 | 7/1991 | Lee | ........................................ 118/500 |
| 5,379,784 | 1/1995 | Nishi et al. | . |
| 5,503,173 | 4/1996 | Kudo et al. | ........................ 211/41.18 X |
| 5,505,577 | 4/1996 | Nishi | ................................... 118/500 X |
| 5,853,496 | 12/1998 | Honda | ................................. 118/500 X |

*Primary Examiner*—Robert W. Gibson, Jr.
*Attorney, Agent, or Firm*—Smith, Gambrell & Russell, LLP

[57] ABSTRACT

In a wafer transport chuck 10 for holding wafers W by means of a pair of holding members 11, each of the holding members 11 has an upper holding portion 12 and a lower holding portion 13 which project from the upper and lower portions of a surface facing another holding member 11, respectively. Each of the upper holding portion 12 and the lower holding portion 13 has a circular arc surface facing the held portions of the wafers W. The upper holding portion 12 has a plurality of upper holding grooves 12a, and the lower holding portion 13 has a plurality of lower holding grooves 13a. Thus, it is possible to make the substrate holder smaller without reducing the strength thereof, and it is possible to improve the cleaning and drying efficiency, so that it is possible to reduce cleaning and drying time and to improve throughput.

11 Claims, 13 Drawing Sheets

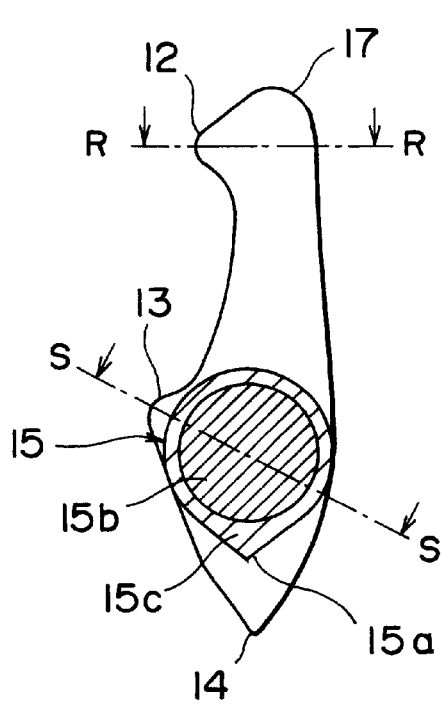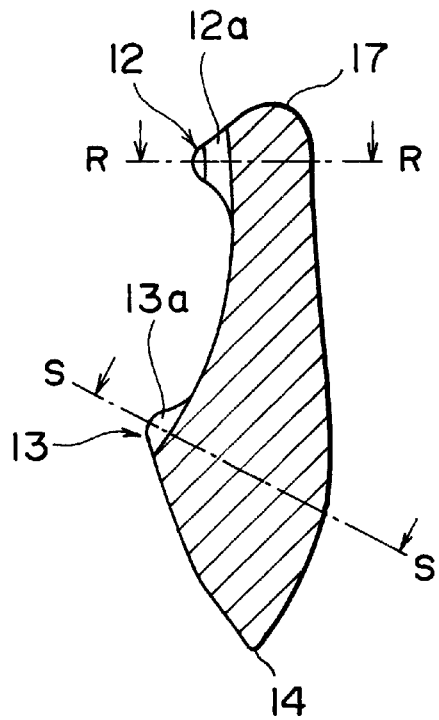
FIG. 7(a)  FIG. 7(b)
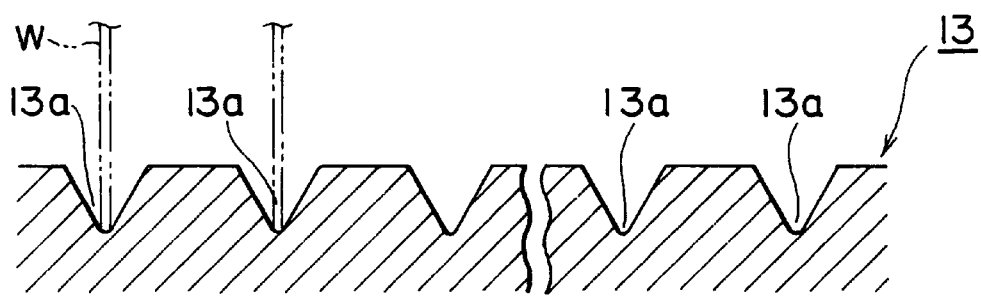
FIG. 8(a)
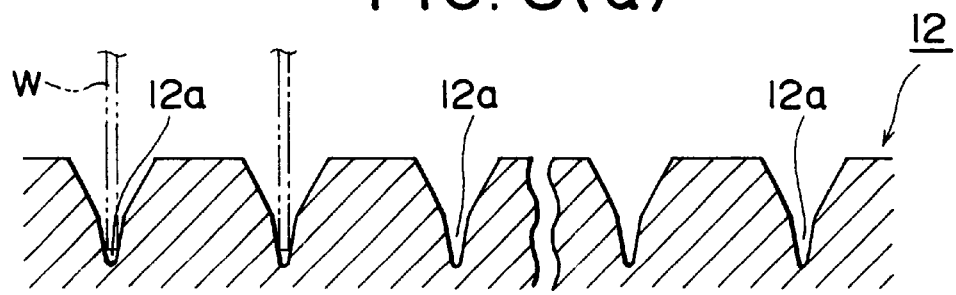
FIG. 8(b)

SUBSTRATE HOLDER, AND SYSTEM AND METHOD FOR CLEANING AND DRYING SAME

BACKGROUND OF THE INVENTION

1. Field of the Invention

The present invention relates generally to a substrate holder, and a system and method for cleaning and drying the substrate holder.

2. Description of Related Art

Japanese Patent Laid-Open No. 7-58074 discloses a conventional substrate holder for holding a substrate, e.g., a semiconductor wafer (which will be hereinafter referred to a wafer ), and a system for cleaning and drying the substrate holder. Referring to FIG. 14, such a substrate holder and such a system for cleaning and drying the substrate holder will be described below.

A substrate holder, e.g., a wafer chuck a, comprises a pair of holding members b which are arranged laterally symmetrical so as to face each other. The holding members b comprises: a pair of substantially U-shaped frame members e, which have horizontally extending base portions parallel to each other, and horizontal portions extending vertically and downwards from both ends of the base portions; upper and lower holding rods c and d which are supported on the lower portions of the frame members e so as to extend horizontally in parallel to each other; and a pair of shaft portions f projecting from one sides of the frame members e in longitudinal directions of the base portions. Furthermore, each of the upper and lower holding rods c and d has a plurality of holding groves g for holding wafers aligned with each other.

On the other hand, a system for cleaning and drying the wafer chuck a mainly comprises: a rectangular tubular cleaning container i which is open upwards and downwards; a dry gas supply means j provided on both sides of the upper portion in the cleaning container i; a cleaning solution supply means k provided below the dry gas supply means j. The dry gas supply means j has a plurality of nozzles (not shown) at regular intervals to inject a dry gas toward the upper holding rods c or the lower holding rods d. The cleaning solution supply means k has a plurality of injection nozzles (not shown) at regular intervals to inject a cleaning solution toward the upper holding rods c or the lower holding rods d.

With the above construction, the cleaning container i of the cleaning/drying system h for the wafer chuck a has is connected to a lifter means (not shown), by which the cleaning container i is movable vertically to be positioned so that the cleaning solution or the dry gas can be efficiently injected onto the upper holding rods c or the lower holding rods d.

The wafer chuck a and the cleaning/drying system therefor are positioned by the relative movement using the lifter means. After the cleaning solution is injected sequentially onto the upper holding rods c and the lower holding rods d to clean the wafer chuck a, the dry gas is injected to the upper holding rods c and the lower holding rods d to dry the wafer chuck a.

However, since the wafer chuck a is formed by assembling a plurality of members, if the size of the wafer increases, the composing members must be thickened to allow the holding members b to have sufficient strength, and the depth and size of the holding groves g must be excessive to maintain the wafers in stable state. Thus, there is a problem in that the total size of the wafer chuck a and the cleaning/drying system h is increased, and there are problems in that the draining of the cleaning solution on the wafer chuck a is bad and a relatively large quantity of cleaning solution remains in the holding groves g after cleaning. Moreover, since the dry gas is difficult to contact some regions of the upper holding rode c or the lower holding rods d even if the dry gas is injected toward the upper holding rods c or the lower holding rods d, there are problems in that the drying time increases, the quantity of the dry gas to be used increases, and the drying efficiency and throughput decrease.

SUMMARY OF THE INVENTION

It is therefore a principal object of the present invention to eliminate the aforementioned problems, and to reduce the size of a substrate holder and substrate holding groves without decreasing the strength of a holding member by forming the holding member by a piece of member and to decrease the drying time and improve the throughput by forming the holding member so that a dry gas can uniformly contact the holding member.

It is another object of the present invention to clean and dry a substrate holder which is suitable for a holding member and which can decrease cleaning and drying time and improve throughput.

In order to accomplish the aforementioned and other objects, according to a first aspect of the present invention, a substrate holder comprises a pair of holding members for holding a substrate, wherein each of the pair of holding members has upper and lower holding portions projecting from upper and lower portions of a surface facing another holding member, respectively, and wherein each of the upper and lower holding portions has a circular arc surface facing a held portion of the substrate, and a plurality of aligned holding grooves.

The upper and lower holding portions may be integrally formed so as to have the circular arc surface facing the held portion of the substrate and so as to have the plurality of aligned holding grooves. Preferably, each of the holding members has an upper end portion having a convex circular arc surface. In addition, an acute draining portion projecting downwards is preferably provided on a lower end portion of each of the holding members. More preferably, each of the holding members has a shaft portion projecting in longitudinal directions from one end of the corresponding one of the holding members, and a splash preventing plate mounted on the shaft portion in vicinity of the corresponding one of the holding members so as to cross the shaft portion. In this case, an acute draining portion projecting downwards is preferably provided on a lower portion of the splash preventing plate. In addition, an acute draining portion projecting downwards is preferably provided on a lower portion of the shaft portion. Moreover, the shaft portion preferably projects from a lower portion of one end of each of the holding members in longitudinal directions.

(1) According to the first aspect of the present invention, since each of the holding members is formed as a single member, it is possible to improved the strength thereof, and it is possible to make the upper and lower holding members smaller. Thus, since it is possible to make the holding grooves smaller, it is possible to reduce the quantity of the cleaning solution remaining in the holding grooves. In addition, since the upper and lower holding portions are formed so as to have the circular arc surface, the cleaning solution is easily drained, and the injected dry gas quickly flows along one surface of the holding member, so that the dry gas can efficiently contact the entire of the first and second holding portions.

In this case, if the upper end portion of the holding members is formed so as to have the convex circular arc surface, it is possible to prevent the cleaning solution from remaining on the top of the holding member, and it is possible to allow the dry gas to more quickly flow on the upper surface of the holding member. In addition, if the draining portion is formed on the lower end portion of the holding member, it is possible to quickly remove the cleaning solution adhered to the surface of the holding member after cleaning the substrate holder. In addition, if the holding member is provided with the shaft portion, it is possible to surely hold the substrate. Moreover, if the splash preventing plate is mounted on the shaft portion, it is possible to prevent the droplets of the cleaning solution from splashing to the outside of the cleaning container during cleaning the substrate holder. In addition, if the draining portions are provided on the lower portions of the splash preventing plate and the shaft portion, it is possible to quickly remove the cleaning solution adhered to the splash preventing plate and the shaft portion. Moreover, if the shaft portion projects from the lower portion of one end of each of the holding members in longitudinal directions, it is possible to strengthen each of holding members against the weight of the substrate, and to easily rotate each of the holding members about the corresponding shaft portion so as to approach and leave another while the substrates are mounted in the holding grooves.

(2) According to a second aspect of the present invention, there is provided a substrate holder cleaning/drying system for cleaning and drying a substrate holder which comprises a pair of holding members for holding a substrate, each of the pair of holding members having upper and lower holding portions projecting from upper and lower portions of a surface facing another holding member, respectively, and each of the upper and lower holding portions having a circular arc surface facing a held portion of the substrate, and a plurality of aligned holding grooves, the cleaning/drying system comprising: a cleaning container having a box shape being open downwards, the cleaning container having a pair of openings parallel to each other, each of the openings being open in an upper surface and one side surface of the cleaning container; cleaning solution supply means provided in an upper portion of the cleaning container; and dry gas supply means provided in vicinity of each of the openings in an upper portion of the cleaning container, the substrate holder and the cleaning container being movable relatively in vertical directions.

The cleaning solution supply means is preferably provided between the openings although its position may be optional as long as the cleaning solution supply means can clean the substrate holder. The dry gas supply means is preferably provided in vicinity of both sides of each of the openings although its position may be optional as long as the dry gas supply means can dry the substrate holder. Moreover, a splash preventing plate projecting inwardly of the cleaning container is preferably provided on a side surface of each of the openings. Preferably, the substrate holder and the cleaning container are relatively reciprocatable in longitudinal directions of the holding members.

According to the second aspect of the present invention, since the upper surface of the cleaning container has the pair of opening, it is possible to simultaneously clean two holding members. If the substrate holder and the cleaning container are relatively movable in vertical directions, the cleaning solution injected from the cleaning solution supply means can uniformly contact the upper and lower holding portions, and the dry gas injected from the dry gas supply means can uniformly contact the upper and lower holding portions. Therefore, it is possible to carry out the cleaning and drying.

In this case, if the cleaning solution supply means is provided between the openings, it is possible to inject the cleaning solution toward both of the holding members from a single cleaning solution supply means. In addition, if the dry gas supply means is provided in vicinity of both sides of each of the openings, it is possible to inject the dry gas toward both sides of the holding member. Moreover, if the splash preventing plate projecting inwardly of the cleaning container is provided, it is possible to prevent the droplets of the cleaning solution from splashing to the outside of the cleaning container during cleaning the substrate holder. In addition, if the substrate holder and the cleaning container are relatively reciprocatable in longitudinal directions of the holding members, the substrate holder can move relatively to the dry gas supply means during injecting the dry gas, so that it is possible to uniformly inject the dry gas the respective holding grooves, which are formed in the upper or lower holding portion so as to be aligned with each other.

(3) According to a third aspect of the present invention, there is provided a substrate holder cleaning/drying, method for cleaning and drying a substrate holder which comprises a pair of holding members for holding a substrate, each of the pair of holding members having upper and lower holding portions projecting from upper and lower portions of a surface facing another holding member, respectively, and each of the upper and lower holding portions having a circular arc surface facing a held portion of the substrate, and a plurality of aligned holding grooves, the cleaning/drying method comprising the steps of: relatively moving a cleaning container and the substrate holder to arrange the pair of holding members of the substrate holder in the cleaning container; injecting a cleaning solution toward an upper holding portion of each of the pair of holding members; injecting the cleaning solution toward a lower holding portion of each of the pair of holding members; injecting a dry gas toward the upper holding portion of each of the pair of holding members; and injecting the dry gas toward the lower holding portion of each of the pair of holding members.

In this case, the substrate holder cleaning/drying method preferably further comprises the steps of: injecting the dry gas onto the upper holding portion of each of the pair of holding members, and relatively reciprocating the substrate holder and the cleaning container in longitudinal directions of the holding members; and injecting the dry gas onto the lower holding portion of each of the pair of holding members, and relatively reciprocating the substrate holder and the cleaning container in longitudinal directions of the holding members.

According to the third aspect of the present invention, if the dry gas is sequentially injected toward the upper and lower holding portions after the cleaning solution is sequentially injected toward the upper and lower holding portion, it is possible to efficiently clean and dry the upper and lower holding portions of the substrate holder. In this case, if the dry gas is injected to the substrate holder and if the substrate holder and the cleaning container are relatively reciprocatable in longitudinal directions of the holding member, it is possible to uniformly inject the dry gas into the holding grooves.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings:

FIG. 7(a) is a side view of a holding member according to the present invention, and FIG. 7(b) is a sectional view thereof;

FIG. 8(a) is a sectional view taken along line R—R of FIG. 7, and FIG. 8(b) is a sectional view taken along line S—S of FIG. 7;

DESCRIPTION OF THE, PREFERRED EMBODIMENTS

Referring now to the accompanying drawings, the preferred embodiments of the present invention will be described in detail below. In the preferred embodiments which will be described below, a substrate holder and a system for cleaning the substrate holder according to the present invention are applied to a semiconductor wafer (substrate) holder, e.g., a wafer transport chuck, and a chuck cleaning/drying system for cleaning and drying the semiconductor wafer holder. In addition, the substrate holder and the system for cleaning and drying the substrate holder are incorporated into a semiconductor wafer cleaning system.

Figure 1:
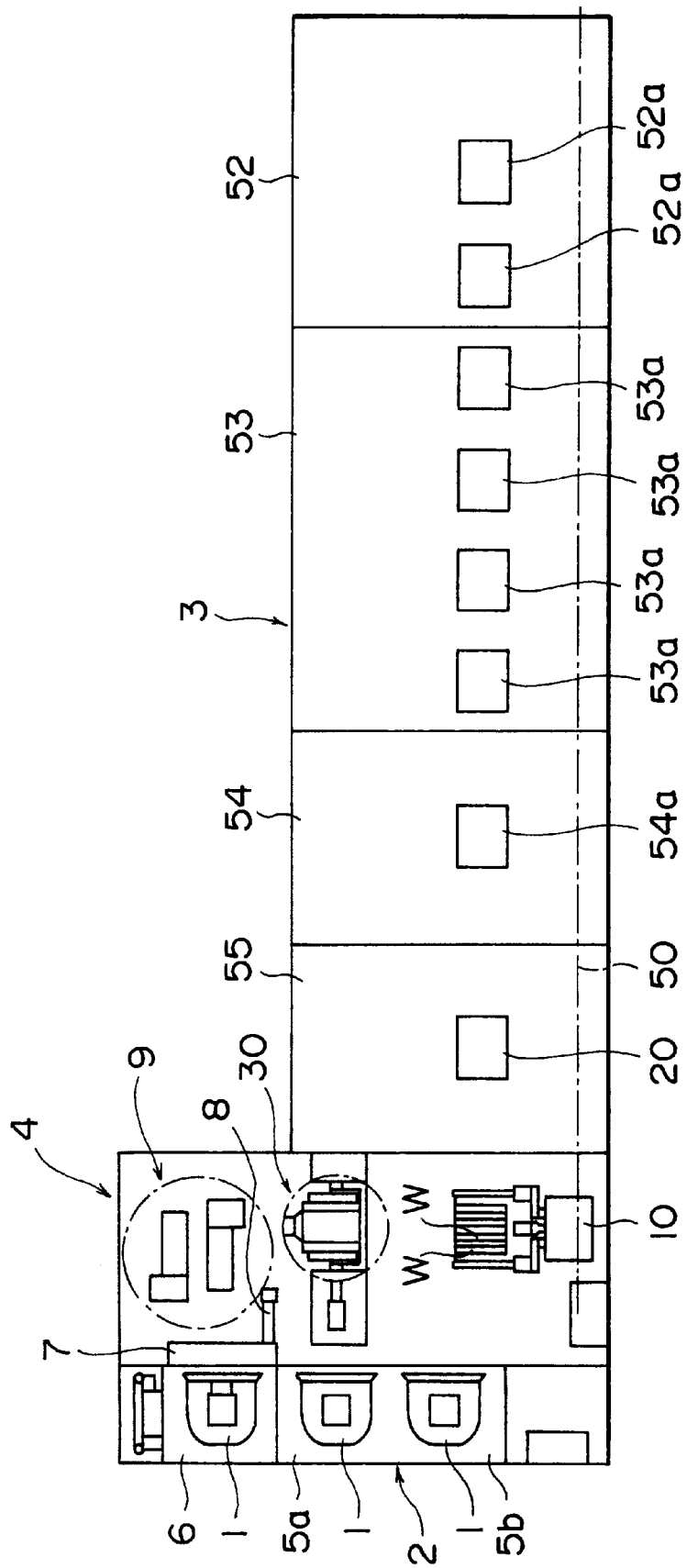
FIG. 1 is a schematic plan view of an embodiment of a semiconductor wafer cleaning system including a wafer transport chuck and a cleaning/drying system according to the present invention.

FIG. 1 is a schematic plan view of an embodiment of a semiconductor wafer cleaning system including a substrate holder and a system for cleaning and drying the substrate holder.

The cleaning system comprises an introducing/discharging section 2 for introducing and discharging a container, e.g., a carrier 1, for housing therein substrates to be treated, e.g., semiconductor wafers (which will be hereinafter referred to as "wafers") W, in a horizontal state; a treatment section 3 for treating the wafers W with a chemical, a cleaning solution and so forth and for drying the wafer W; and a delivery section, e.g., an interface section 4, arranged between the introducing/discharging section 2 and the treatment section 2, for delivering, positioning, attitude-changing and space-adjusting the wafers W.

The introducing/discharging section 2 has a carrier introducing part 5a and a carrier discharging part 5b on one side of the cleaning system. The introducing/discharging section 2 also has a wafer introducing/discharging part 6. Between the carrier introducing part 5a and the wafer introducing/discharging part 6, a transport mechanism (not shown) is provided. The transport mechanism is designed to convey the carrier 1 from the carrier introducing part 5a to the wafer introducing/discharging part 6.

The treatment section 3 comprises: a first treatment section 52 having a first treatment unit 52a for removing particles and organic contaminants which are adhered to the wafers W; a second treatment section 53 having a second treatment unit 53a for removing metallic contaminants adhered to the wafers W; a third treatment section 54 having a cleaning/drying unit 54a for removing an oxide film adhered to the wafers W and for drying the wafers W; and a four treatment section 55 having a chuck cleaning/drying system 20, according to the present invention, for cleaning and drying a wafer transport chuck (substrate holder) 10 which will be described later. Furthermore, it is not always required to provide the fourth treatment section 55 between the third treatment section 54 and the interface section 4. For example, the fourth treatment section 55 may be provided between the second treatment section 53 and the third treatment section 54, or adjacent to the first treatment section 52.

Each of the carrier discharging part 5a and the wafer introducing/discharging part 6 has a carrier lifter (not shown), by which an empty carrier 1 is delivered to a carrier waiting part (not shown) provided above the introducing/discharging section 2 and by which the empty carrier 1 is received from the carrier waiting part. The carrier waiting part has a carrier transport robot (not shown) which is movable in horizontal directions (X, Y directions) and in vertical directions (Z directions). By the carrier transport robot, the empty carrier 1 conveyed from the wafer introducing/discharging part 6 is arranged and discharged to the carrier discharging part 5b. In the carrier waiting part, the empty carrier is not only waiting, but a carrier 1 housing therein the wafers W may be also waiting.

The carrier 1 has an opening (not shown) on one side thereof. The carrier 1 comprises: a container body (not shown) having an inner wall which has holding grooves (not shown) for holding a plurality of wafers W, e.g., 25 wafers W, at regular intervals in a horizontal state; and a lid (not shown) for opening and closing the opening of the container body. The lid cam be open and closed by means of a lid opening/closing mechanism 7 which will be described later.

The wafer introducing/discharging part 6 is open to the interface section 4, and the lid opening/closing unit 7 is provided in the opening of the wafer introducing/discharging part 6. By the lid opening/closing unit 7, the lid (not shown) of the carrier 1 can be open and closed. Therefore, the lid of the carrier 1 housing therein untreated wafers W conveyed to the wafer introducing/(discharging part 6 can removed by the lid opening/closing unit 7 to allow the wafers W in the carrier 1 to be discharged. After all of the wafers W are discharged, the lid can be closed by the lid opening/closing unit 7. The lid of the empty carrier 1 conveyed from the carrier waiting part to the wafer introducing/discharging part 6 can be removed by the lid opening/closing unit 7 to allow the wafers W to be introduced into the carrier 1. After all of the wafers W are introduced, the lid can be closed by the lid opening/closing unit 7 again. In the vicinity of the opening of the wafer introducing/discharging part 6, a mapping sensor 8 for detecting the number of waders W housed in the carrier 1 is provided.

The interface section 4 includes: a wafer transport arm 9 for holding a plurality of wafers W, e.g., 25 wafers W, in a horizontal state and for delivering the wafers W in a horizontal state between the carrier 1 of the wafer introducing/discharging part 6 and the interface section 4; a space adjusting means, e.g., a pitch changer (not shown), for holding a plurality of wafers W. e.g., 50 wafers W, at regular intervals in a vertical state; a holding means, e.g., an attitude changing unit 30, arranged between the wafer transport arm 9 and the pitch changer, for changing the state of a plurality of wafers W, e.g., 25 wafers W, from the horizontal state to the vertical state or from the vertical state to the horizontal state; and a position detecting means, e.g., a notch aligner (not shown), for detecting a notch (not shown) formed in each of the wafers W changed to the vertical state. The interface section 4 also includes a transport channel 50 communicated with the treatment section 3. The substrate holder, e.g., the wafer transport chuck 10 according to the present invention, is movable on the transport channel 50 for holding and conveying the wafers W along the transport channel 50 to deliver the wafers W to any one of the first through third treatment units 52a through 54a.

Figure 2:
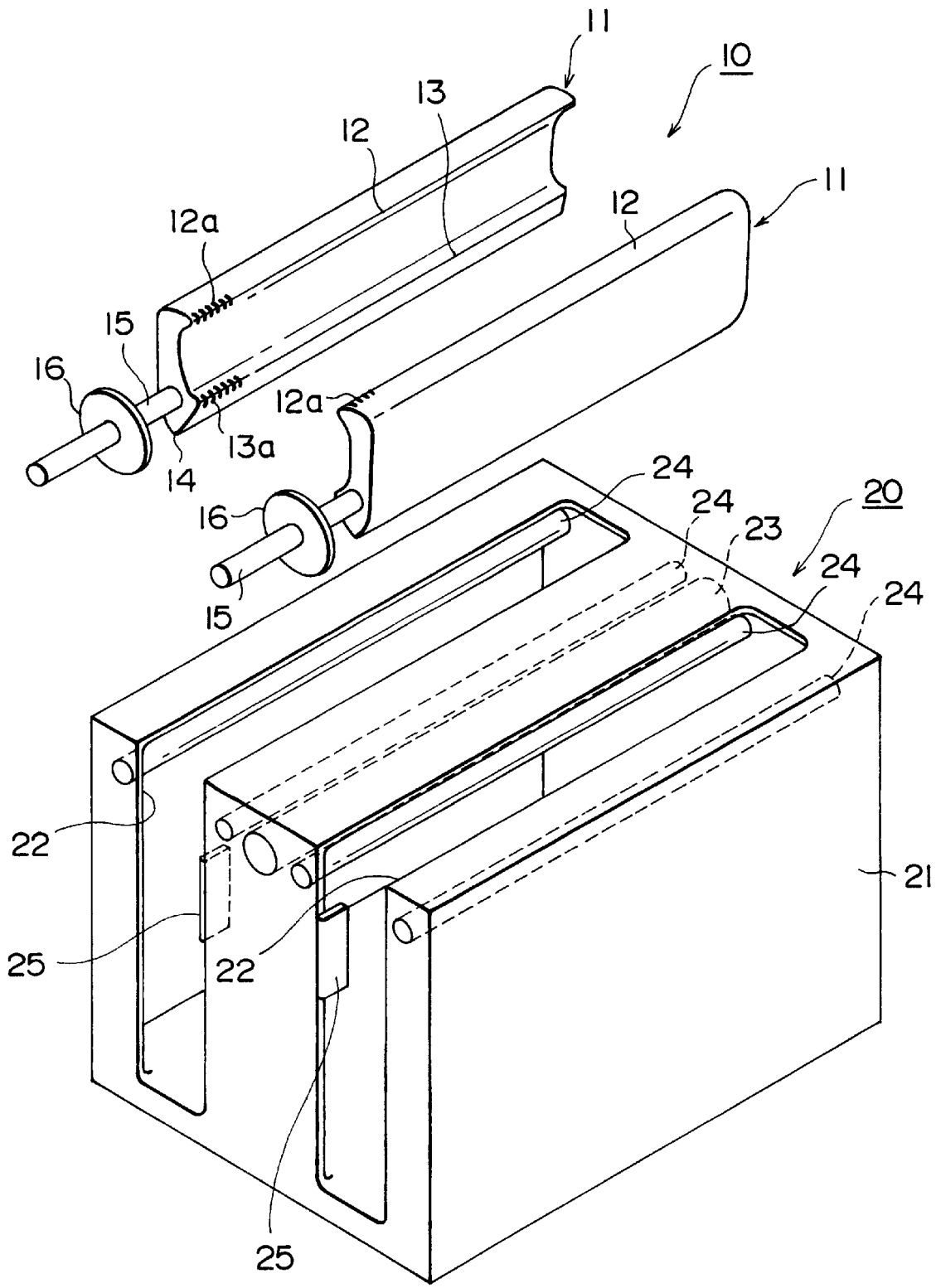
FIG. 2 is a perspective view of a principal part of a wafer transport chuck and a cleaning/drying system according to the present invention.
Figure 4:
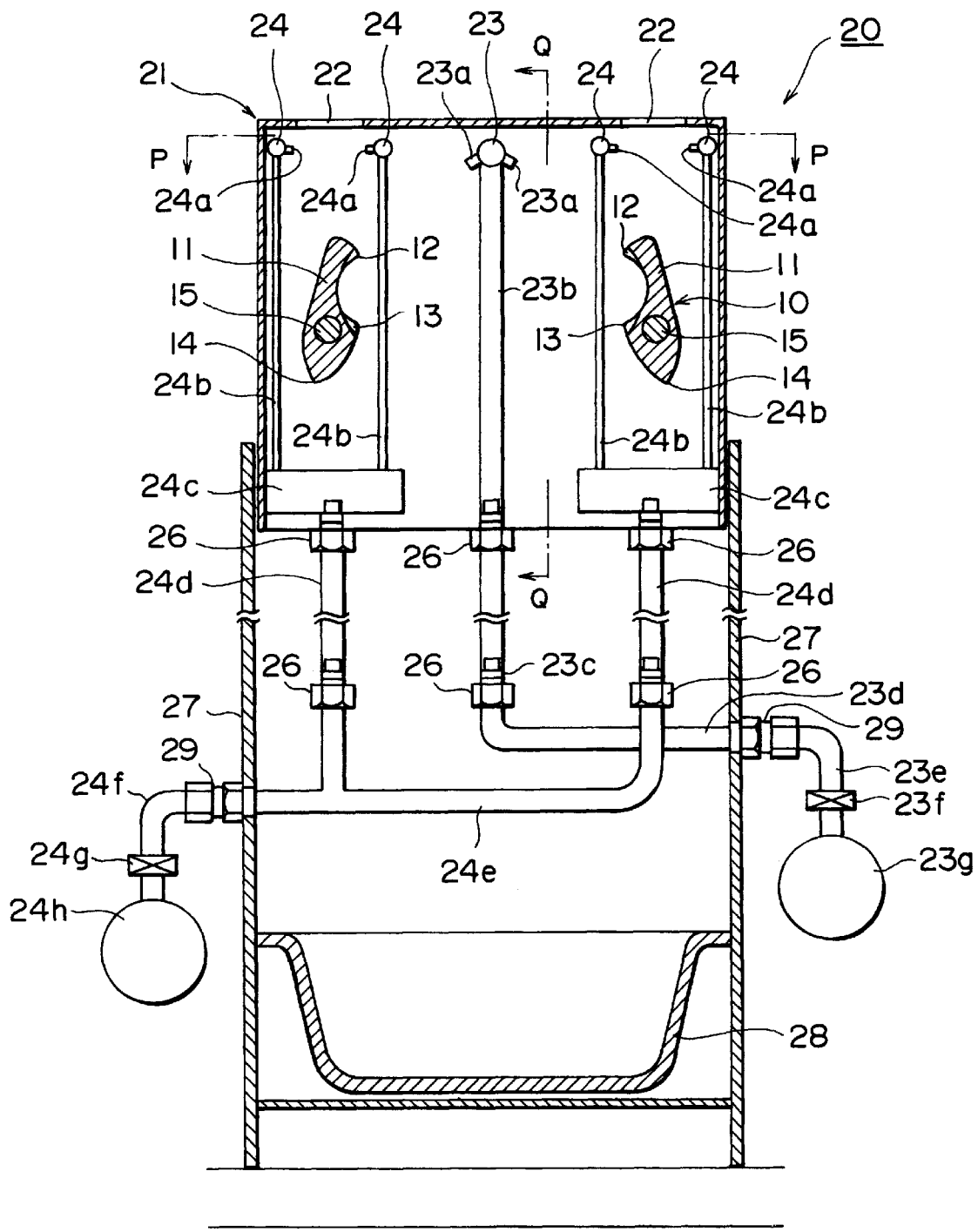
FIG. 4 is a sectional view of a cleaning/drying system for a wafer transport chuck according to the present invention.
Figure 5:
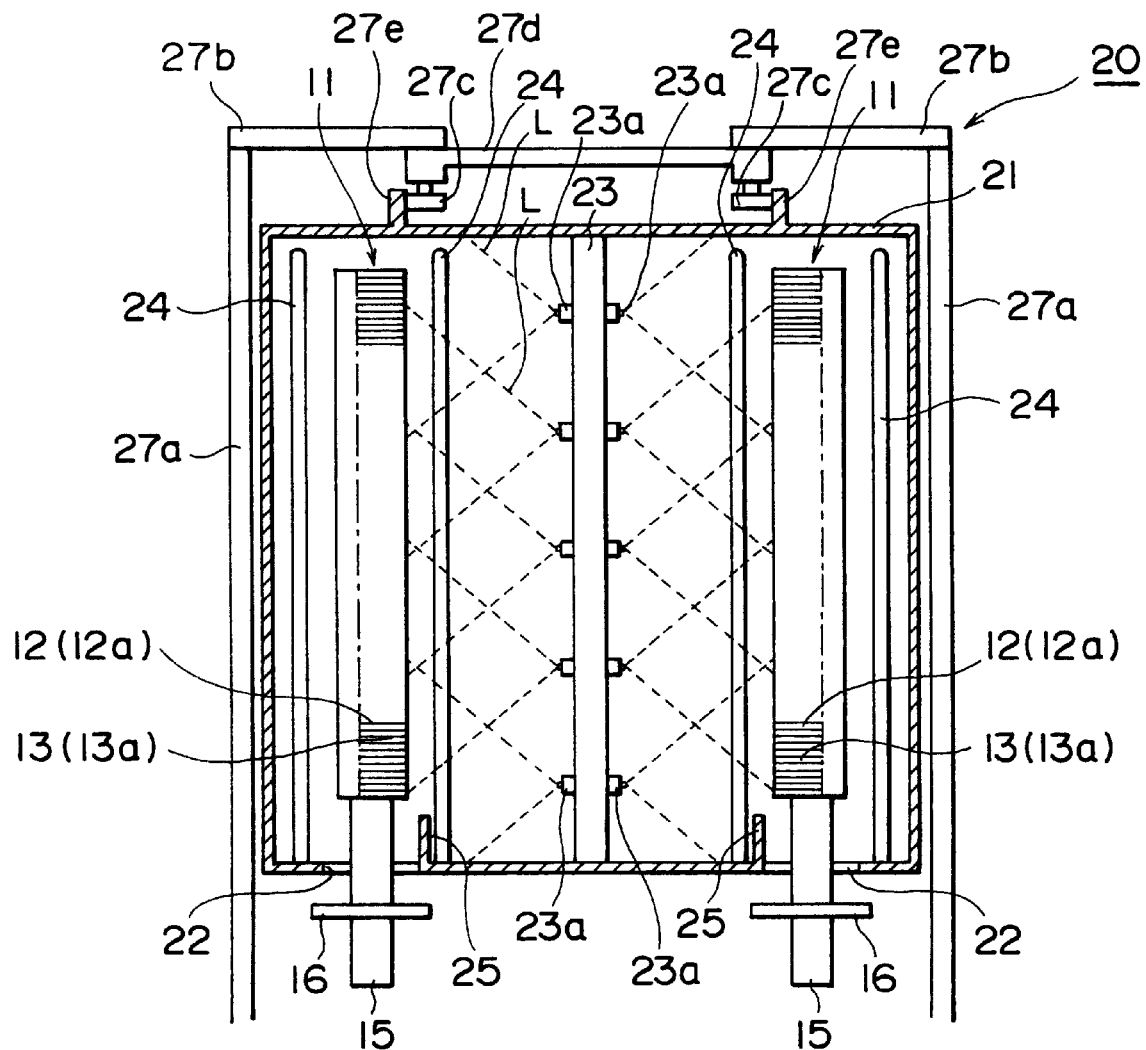
FIG. 5 is a sectional view taken along line P—P of FIG. 4.
Figure 6:
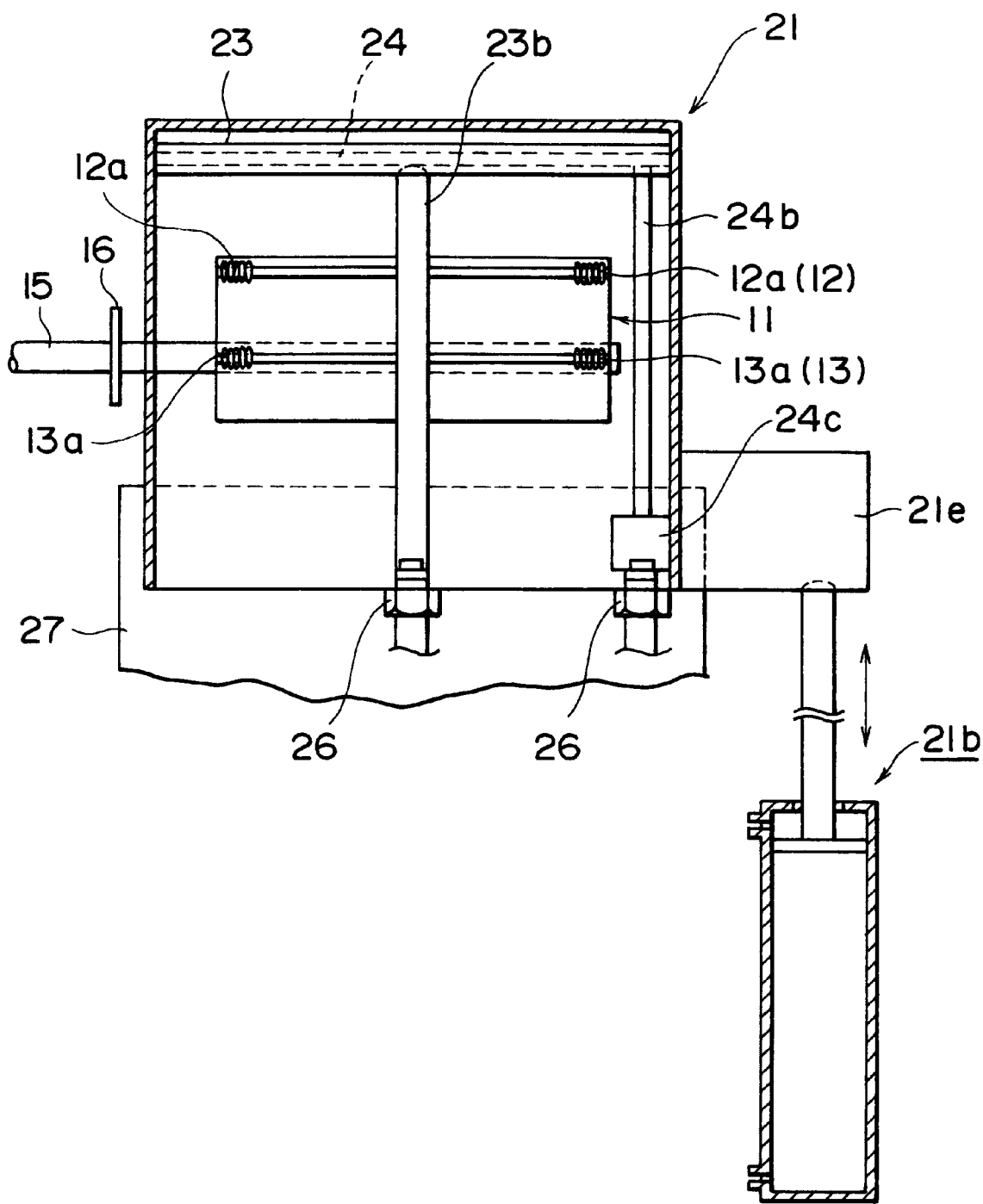
FIG. 6 is a sectional view taken along line Q—Q of FIG. 4.

Referring to the accompanying drawings, the wafer transport chuck (substrate holder) 10 and the cleaning/drying system 20 according to the present invention will be described in detail below. FIG. 2 is a schematic perspective view of a principal part of the wafer transport chuck 10 and the cleaning/drying system 20, and FIG. 4 is a schematic sectional view of the whole construction of the cleaning/drying system 20. In addition, FIG. 5 is a sectional view taken along line P—P of FIG. 4, and FIG. 6 is a sectional view taken along line Q—Q of FIG. 4.

The wafer transport chuck 10 is made of a material having excellent corrosion resistance and chemical resistance, e.g., a polyether ether ketone (which will be hereinafter referred to as a PEEK ) resin. The wafer transport chuck 10 mainly comprises a pair of holding members 11 which are capable of holding the wafers W, and a pair of shaft portions 15, each of which projects from one end of the corresponding holding member 11 so as to extend in longitudinal directions of the corresponding one of the holding members 11. The other end of each of the shaft portions 15 is connected to moving means (not shown) and driving means (not shown) so as to be capable of reciprocating along the transport channel 50. The holding members 11 are movable to approach and leave each other to clamp (hold) the wafers W. The holding members 11 can also reciprocate in longitudinal directions. Since each of the shaft portions 15 projects in the longitudinal direction from the lower portion of one end of the corresponding one of the holding member 11, each of the holding members 11 can be strengthened against the weight of the wafers W, and each of the holding members 11 can easily rotate about the corresponding one of the shaft portion 15 so as to approach and leave another while the wafers W are mounted in lower holding grooves 13a.

As shown in FIGS. 2 and 7, each of the holding members 11 has an upper holding portion 12 and a lower holding portion 13, which project from the upper and lower portions of a surface facing another holding member 11. Each of the holding members 11 also has a convex circular arc portion 17 on the upper end portion thereof, and an acute draining portion projecting downwards, e.g., edge 14, on the lower end portion thereof. Each of the upper holding portion 12 and the lower holding portion 13 is formed so as to have a circular arc surface facing the held portions of the wafers W. The upper holding portion 12 has a plurality of upper holding grooves, e.g., 50 upper holding grooves 12a, which are aligned with each other. The lower holding portion 13 also has a plurality of lower holding grooves 13a, which are aligned with each other and the number of which is the same as the number of the upper holding grooves 12a.

Each of the lower holding grooves 13a has a substantially V-shaped cross section to hold the peripheral portion of the corresponding one of the wafers W (see FIG. 8(*a*)). Each of the upper holding grooves 12a has a substantially Y-shaped cross section to prevent crush and reversal of the corresponding one of the wafers W (see FIG. 8(*b*)).

Figure 3A:
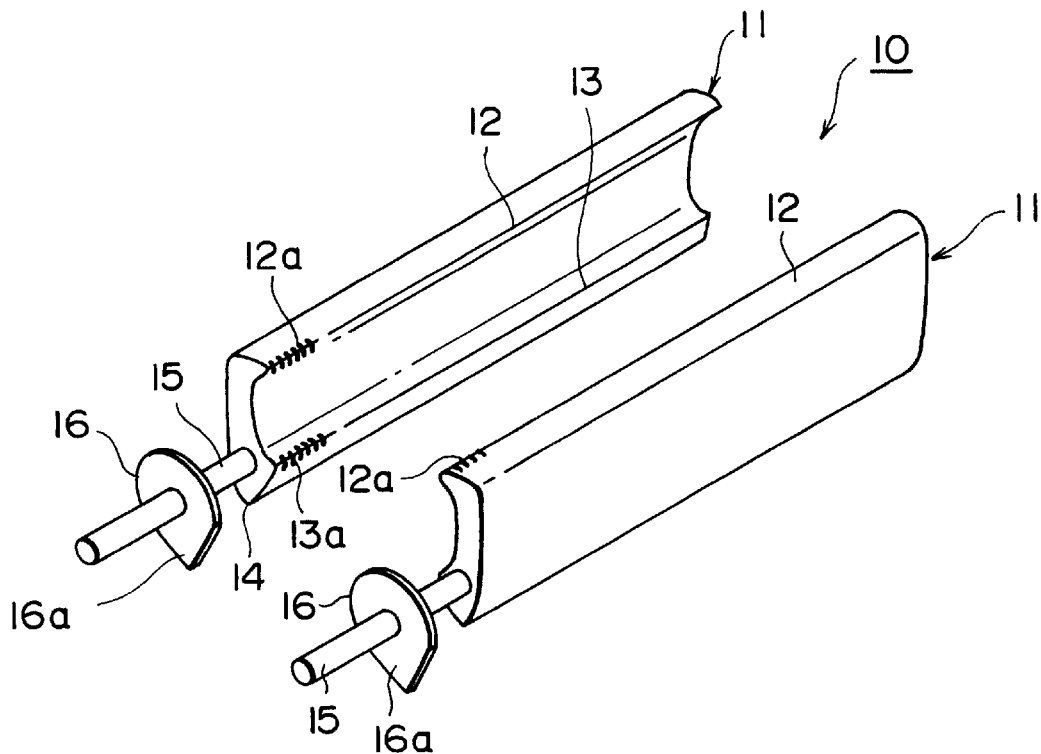
FIGS. 3(a) and 3(b) are perspective view of other embodiments of splash preventing plates according to the present invention.
Figure 3B:
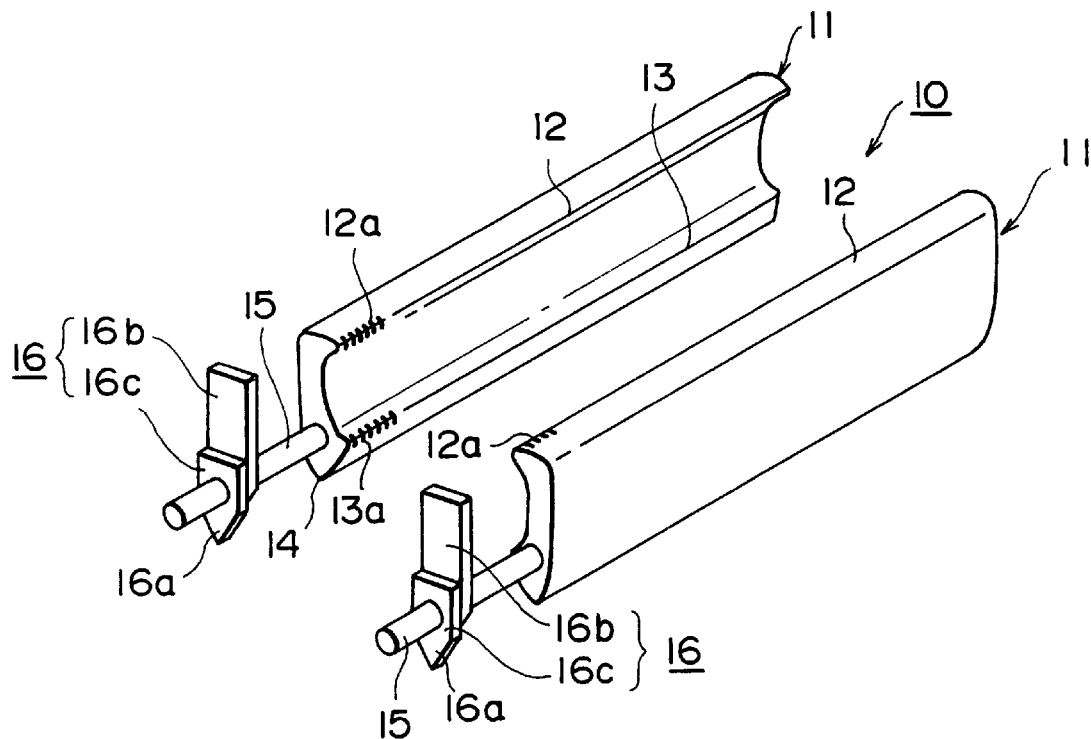

The shaft portion 15 comprises a core 15b of a rod member of, e.g., stainless steel, and a protecting member 15c of, e.g., a PEEK resin, which is coated on the outer periphery of the core 15b. On the lower side of the shaft portion 15, i.e., on the lower side of the protecting member 15c, an acute draining portion projecting downward, e.g., an edge 15a, is provided (see FIG. 7(*a*)). With this construction, it is possible to quickly remove a cleaning solution, which will be described later, e.g., pure water, which is adhered to the shaft portion 15 during cleaning the wafer transport chuck 10. A disc-shaped splash preventing plate 16 of, e.g., a PEEK resin, is provided on the shaft portion 15 in vicinity of the holding member 11 so as to cross the shaft portion 15. Thus, it is possible to prevent the cleaning solution, e.g., pure water, from splashing to the outside of a cleaning container 21, which will be described later, during cleaning the wafer transport chuck 10. In addition, as shown in FIG. 3(*a*), an acute draining portion projecting downwards, e.g., an edge 16a, is preferably provided on the lower portion of each of the splash preventing plates 16. If the edge 16a is thus provided on the lower portion of each of the splash preventing plates 16, it is possible to quickly remove the cleaning solution, e.g., pure water, which is adhered to the splash preventing plate during cleaning. The splash preventing plates 16 should not be limited to the plates having the above described shape. For example, as shown in FIG. 3(*b*), each of the splash preventing plates 16 may comprise a rectangular splash preventing plate 16b extending upwards, and an edge member 16c having an edge 16a on the lower end thereof. The splash preventing plate 16b may be integrally formed with the edge member 16c. If the upward extending portion of the splash preventing plate 16 is thus provided, it is possible to receive the droplets of pure water splashed from top even if the wafer transport chuck 10 moves downwards.

Referring to FIGS. 2 thorough 6, the chuck cleaning/drying system 20 will be described below.

The chuck cleaning/drying system 20 mainly comprises a cleaning container 21 having, e.g., a box-shape, which is open downwards, the cleaning container 21 having a pair of openings 22 which are parallel to each other and which are formed in the upper surface and one side surface thereof; a cleaning solution supply means, e.g., a pure water injection pipe 23, provided in the upper portion of the cleaning container 21 between the pair of openings 22, for injecting a cleaning solution, e.g., pure water L, onto the wafer transport chuck 10; and dry gas supply means, e.g., two pair of gas injection pipes 24, provided in the upper portion of the cleaning container 21 on both sides of each of the openings 22, for injecting a dry gas, e.g., air, onto the wafer transport chuck 10. As the dry gas, other gases than air, e.g., nitrogen gas, may be used. With this construction, since it is possible to cause pure water L or the gas to effectively contact the upper holding grooves 12a or the lower holding grooves 13a, it is possible to surely clean and dry the wafer transport chuck 10, and it is possible to reduce cleaning and drying time.

The distance between the openings 22 and the width of each of the openings 22 are designed so that the openings 22 can simultaneously receive the pair of holding members 11. On the side surface of each of the openings 22, a splash preventing plate 25 projecting inwardly of the cleaning container 21 is provided. Thus, it is possible to prevent the droplets of pure water L from splashing to the outside of the cleaning container 21 during cleaning. On a side of the lower portion of the cleaning container 21, a bracket 21a projecting outwards is provided. To the bracket 21a, a lifter means, e.g., a cylinder 21b, for moving the cleaning container 21 in vertical directions is connected (see FIG. 6). In the vicinity of both sides of the cleaning container 21, a pair of side walls 27a are provided. A pair of guide walls 27b extend from one end of each of the side walls 27a toward the opposite side wall 27a. Between the guide walls 27b, a guide plate 27d for supporting thereon guide rollers 27c, which are rotatable in vertical directions, is mounted. The guide rollers 27c are rotatably supported on the guide plate 27d and arranged at regular intervals in vertical directions parallel to the side surfaces of the cleaning container 21. On the outer side surfaces of the cleaning container 21, guide projections 27e rotatably contacting the guide rollers 27c are provided. Therefore, when the cylinder 21b is driven, the cleaning container 21 can stably and surely move in vertical directions while the guide rollers 27c contact the guide projections 27e. In the lower portion between the side walls 27a, a receiver container 28 for receiving pure water, which has been used for cleaning the holding member 11, is provided.

The pure water injection pipe 23 has a plurality of injection nozzles 23a on both sides thereof at regular intervals (5 injection nozzles on each of both sides in FIG. 5), so that it is possible to inject pure water L so as to extend in longitudinal directions of the holding members 11 housed in the cleaning container 21. The pure water injection pipe 23 is connected, via various supply pipes, to a pure water supply source 23g provided outside of the cleaning container 21.

As shown in FIG. 2, one end of a first supply pipe 23b extending downwards in the cleaning container 21 is connected to the lower portion of the pure water injection pipe 23. The other end of the first supply pipe 23b is connected to a second supply pipe 23c via a connector 26 in the lower end portion of the cleaning container 21. The second supply pipe 23c is formed of, e.g., a longish flexible tube, so as to allow the vertical movement of the cleaning container 21. The lower end portion of the second supply pipe 23c is connected to one end of a third supply pipe 23d via a connector 26, and the other end of the third supply pipe 23d is connected to one end of a fourth supply pipe 23e via a connector 29. In the fourth supply pipe 23e, a shutoff valve 23f is provided. The other end of the fourth supply pipe 23e is connected to the pure water supply source 23g.

Each of the gas injection pipes 24 arranged on both sides of each of the openings 22 of the cleaning container 21 has a plurality of injection nozzles 24a which are arranged at regular intervals and which project toward the facing gas injection pipe 24 so that a gas, e.g., air, can be effectively injected toward each of the holding members 11 housed in the cleaning container 21. Each of the gas injection pipes 24 may have a plurality of holes in place of the projecting injection nozzles 24a. In addition, each of the gas injection pipes 24 is connected to a gas supply source, e.g., an air supply source 24h, via various supply pipes.

As shown in FIG. 2, one end of a first supply pipe 24b extending downwards in the cleaning container 21 is connected to the lower portion of each of the gas injection pipes 24. The other ends of each pair of first supply pipes 24b are connected to a fork connector 24c in the vicinity of the lower opening of the cleaning container 21. A second supply pipe 24d is connected to the lower end of each of the fork connectors 24c via a connector 26. The second supply pipe 24d is formed of, e.g., a longish flexible tube, so as to allow the vertical movement of the cleaning container 21. The lower end portion of each of the second supply pipes 24d is connected to a third supply pipe 24e of a fork branch pipe via a connector 26. The other end of the third supply pipe 24e is connected to one end of a fourth supply pipe 24f via a connector 29. In the fourth supply pipe 24f, a shut-off valve 24g is provided. The other end of the fourth supply pipe 24 is connected to the air supply source 24h.

With this construction, the wafer transport chuck 10 has strength sufficient to hold the wafers W even if the size of the holding members 11 is reduced. Thus, since it is possible to form the upper and lower holding grooves 12a, 13b as small as possible, it is possible to efficiently clean the holding members 11 and it is possible to reduce the quantity of the cleaning solution, e.g., pure water L, remaining in the upper and lower holding grooves 12a, 13a.

When the convex circular arc portion 17 is formed on the upper end portion of each of the holding members 11 and when each of the upper holding portion 12 and the lower holding portion 13 is formed so as to have a circular arc surface facing the held portion of each of the wafers W, it is possible to improve the draining performance of the cleaning solution and it is possible to allow the dry gas, e.g., air, to quickly and uniformly flow on the surface of the holding member 11. When the edge 14 is provided on the lower end portion of each of the holding member 11, pure water L adhered to the surface of the holding member 11 quickly flows down along the edge 14, so that it is possible to effectively remove pure water L adhered to the holding member 11 after cleaning. Therefore, it is possible to reduce the time required for cleaning and drying and it is possible to reduce the quantity of air to be used, so that it is possible to improve cleaning and drying efficiency and throughput.

Figure 9:
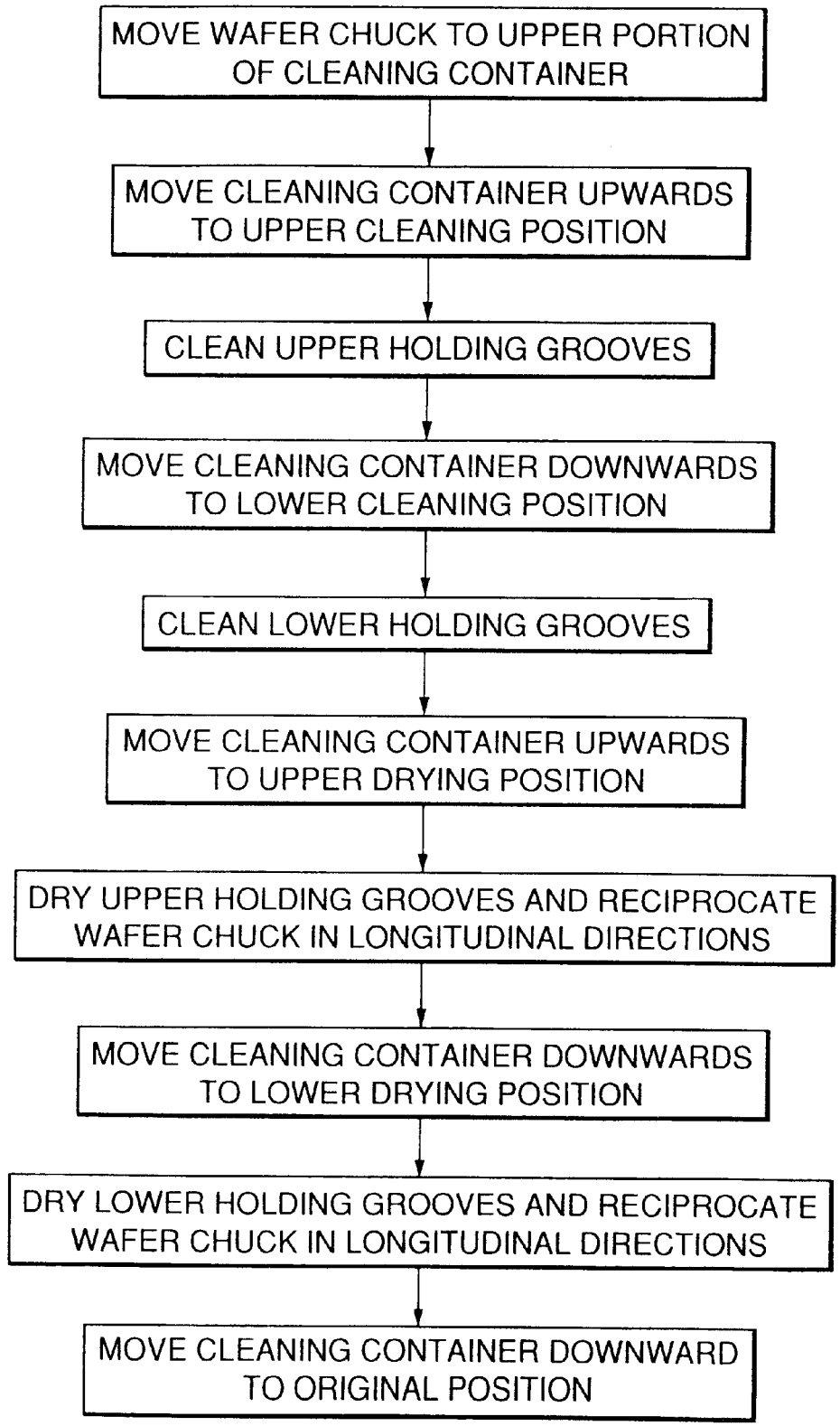
FIG. 9 is a flow chart of a method for cleaning and drying a wafer transport chuck according to the present invention.
Figure 10:
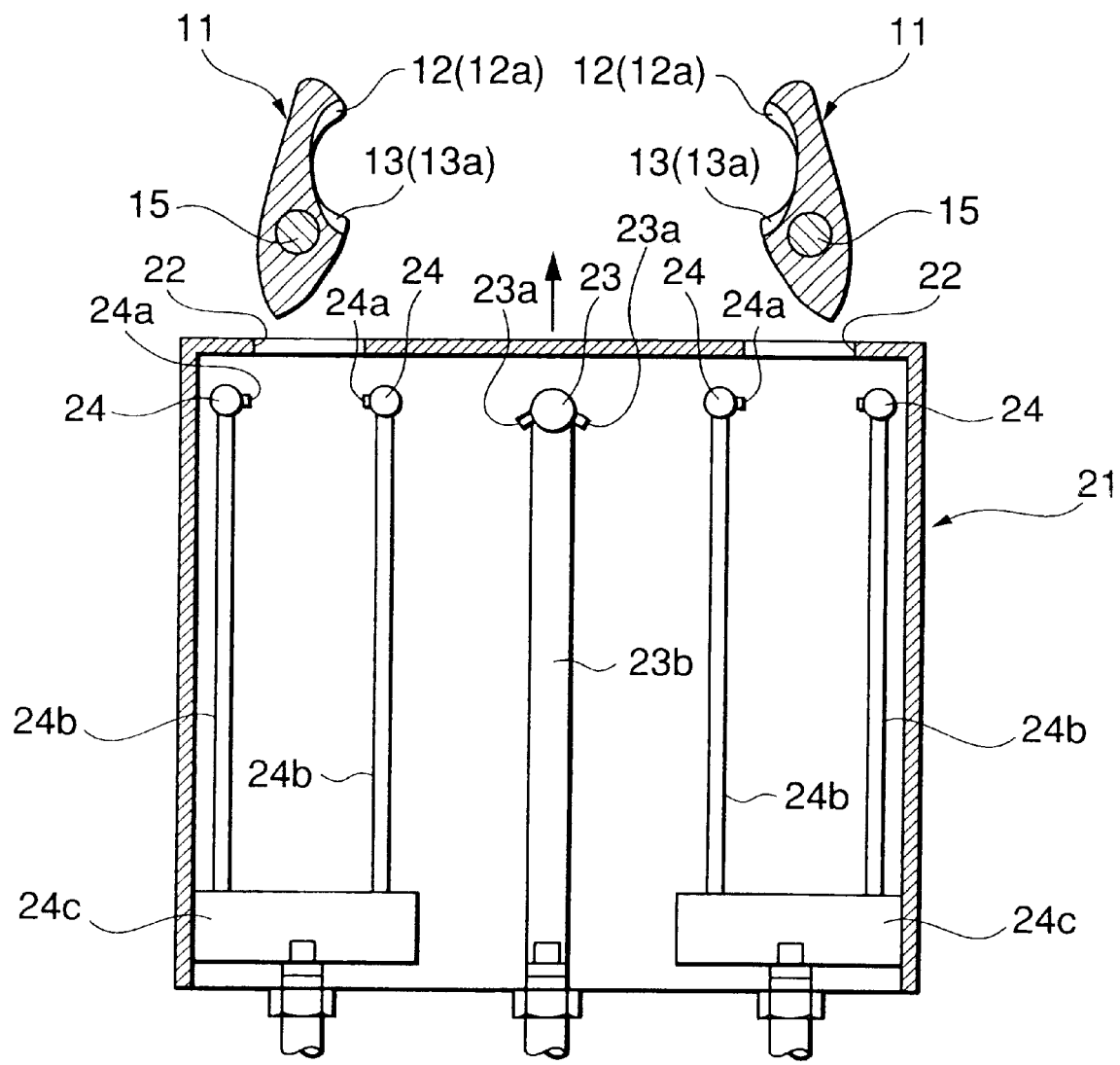
FIG. 10 is a schematic sectional view showing a step of positioning a wafer transport chuck in a cleaning container.
Figure 11A:
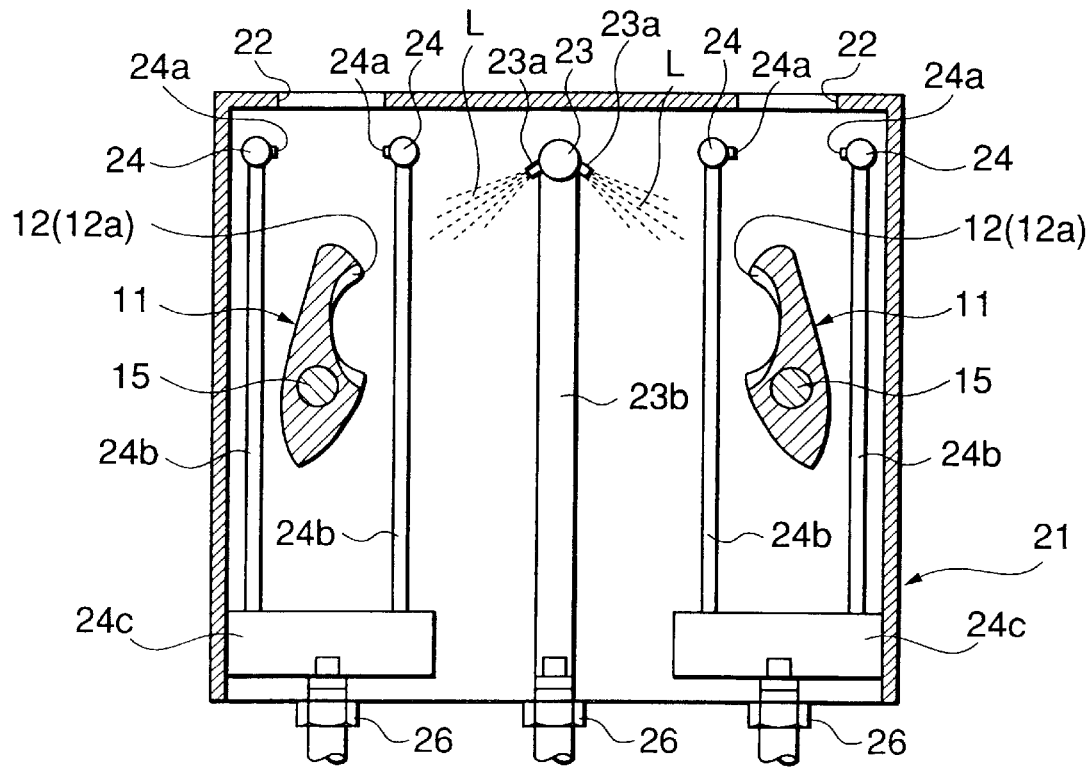
FIG. 11(a) is a schematic sectional view showing a step of cleaning upper holding portions according to the present invention.
Figure 11B:
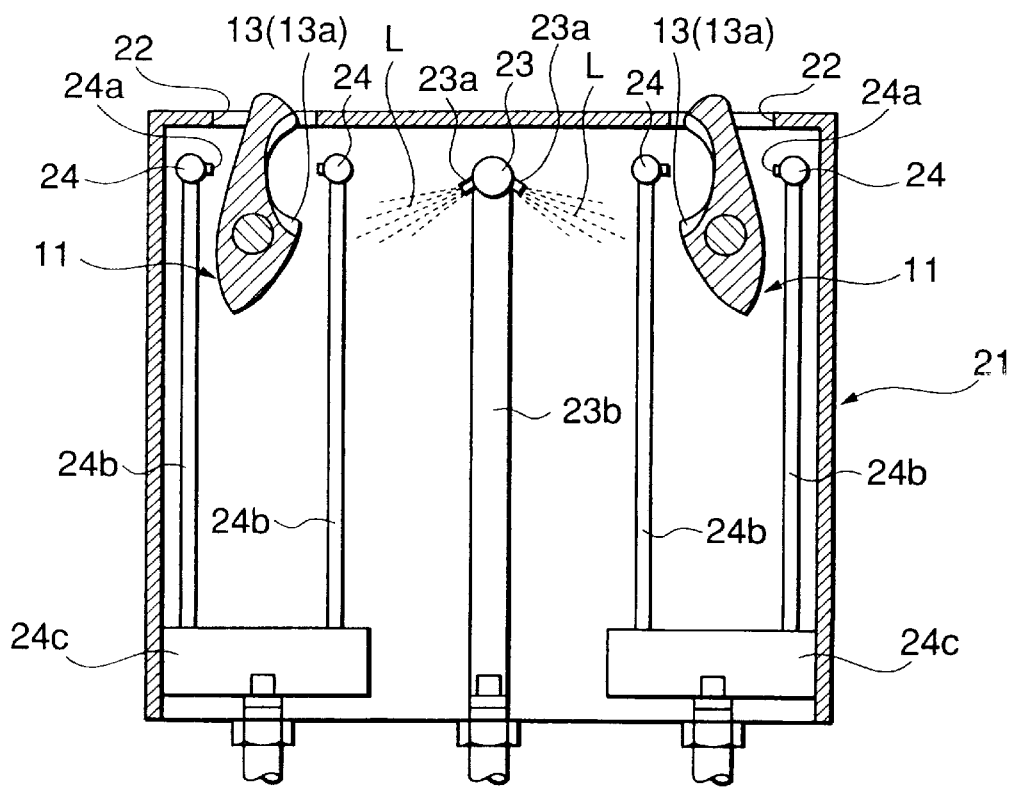
FIG. 11(b) is a schematic sectional view showing a step of cleaning lower holding portions according to the present invention.
Figure 12:
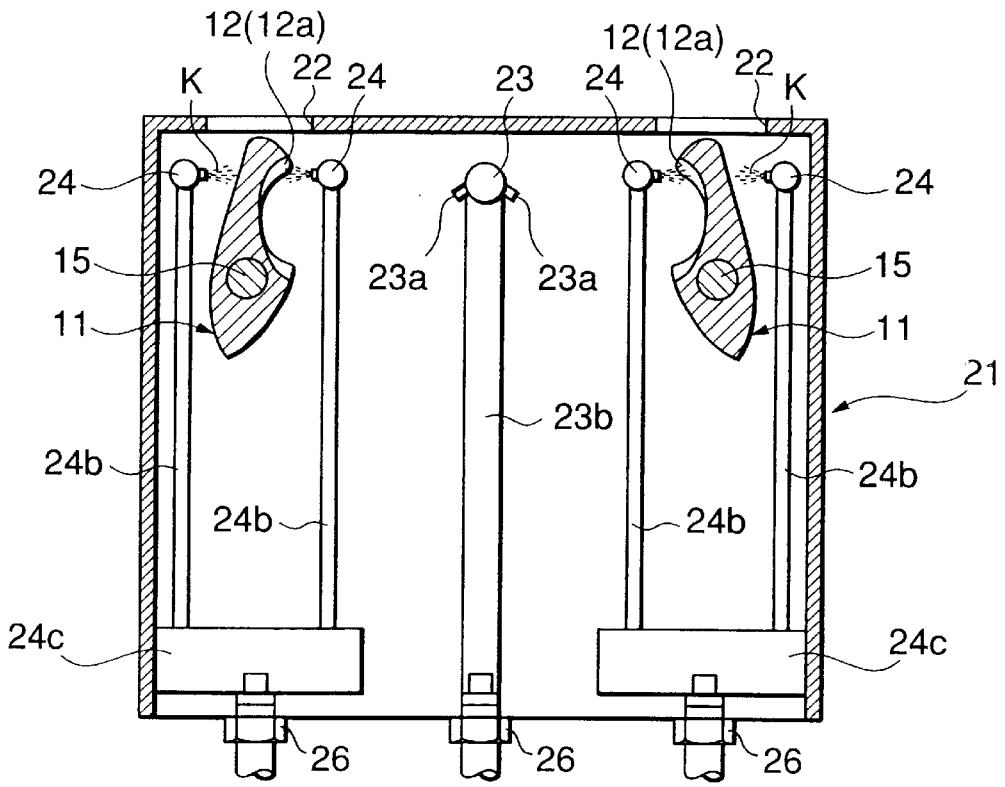
FIG. 12(a) is a schematic sectional view showing a step of drying upper holding portions according to the present invention.
FIG. 12(b) is a schematic sectional view showing a step of drying lower holding portions according to the present invention.
Figure 12:
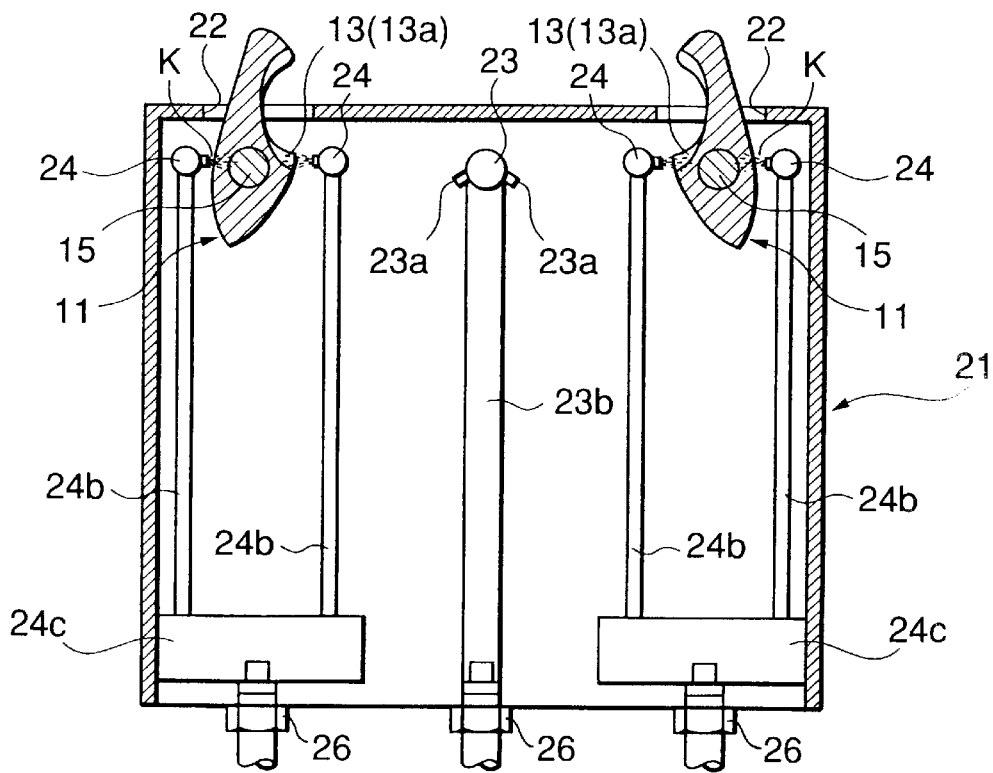

Referring to a flow chart of FIG. 9 and process drawings of FIGS. 10 through 13, steps of cleaning and drying the wafer transport chuck 10 using the cleaning/drying system 20 will be described below.

First, after a series of steps of cleaning and drying the wafers W are completed, the wafer transport chuck 10, which has delivered the wafers W to the interface section 4, moves to the fourth treatment section 55, and stops at the upper portion of the cleaning container 21 of the chuck cleaning/drying system 20 (step A). Thereafter, the cylinder 21b connected to the bracket 21a of the cleaning container 21 is driven to start the upward movement of the cleaning container 21 (see FIG. 10). By this upward movement, the respective holding members 11 are introduced into the cleaning container 21 via the openings 22 of the cleaning container 21 from top. Then, when the cleaning container 21 reaches a position (which will be hereinafter referred to an upper cleaning position) at which pure water L injected from the injection nozzle 23a of the pure water injection pipe 23 can most efficiently contact the upper holding grooves 12a formed in the upper holding portion 12 of each of the holding members 11, the cylinder 21b is stopped to stop the upward movement of the cleaning container 21 (step B). Thereafter, the shut-off valve 23f is open to supply pure water L from the pure water supply source 23g to inject pure water L toward the upper holding portion 12 from the injection nozzle 23a of the pure water injection pipe 23 to clean the upper holding portion 12 and the upper holding grooves 12a (step C, see FIG. 11(a)).

After the upper holding grooves 12a is completely cleaned, the shut-off valve 23f is closed to stop the supply of pure water L, and the cylinder 21b is driven to move the cleaning container 21. Then, when the cleaning container 21 reaches a position (which will be hereinafter referred to a lower cleaning position) at which pure water L injected from the injection nozzle 23a of the pure water injection pipe 23 can most efficiently contact the lower holding grooves 13a formed in the lower holding portion 13 of each of the holding members 11, the cylinder 21b is stopped to stop the downward movement of the cleaning container 21 (step D). Thereafter, the shut-off valve 23f is open to supply pure water L from the pure water supply source 23g to inject pure water L toward the lower holding portion 13 from the injection nozzle 23a of the pure water injection pipe 23 to clean the lower holding portion 13 and the lower holding grooves 13a (step E, see FIG. 11(b)). Furthermore, the supply of pure water L may be stopped once after the upper holding grooves 12a are cleaned as mentioned above, or the cleaning container 21 may be moved downwards to the lower cleaning position while supplying pure water L.

After the lower holding grooves 13a is completely cleaned, the shutoff valve 23f is closed to stop the supply of pure water L, and the cylinder 21b is driven to move the cleaning container 21 upwards. Then, when the cleaning container 21 reaches a position (which will be hereinafter referred to an upper drying position) at which a gas, e.g., air K, injected from the injection nozzle 24a of the gas injection pipe 24 can most efficiently contact the upper holding grooves 12a formed in the upper holding portion 12 of each of the holding members 11, the cylinder 21b is stopped to stop the upward movement of the cleaning container 21 (step F). Thereafter, the shut-off valve 24g is open to supply air K from the air supply source 24h to inject air K toward both sides of the upper holding portion 12 from the injection nozzle 24a of each of the air injection pipes 24 to dry the upper holding portion 12 (step G, see FIG. 12(a)).

At this time, the driving means (not shown) connected to the shaft portion 15 of the holding member 11 is driven to reciprocate the wafer transport chuck 10 in longitudinal directions of the holding member 11 (step G). Thus, air K can uniformly contact all of the upper holding grooves 12a, so that it is possible to further improve drying efficiency and to reduce drying time.

After the upper holding grooves 12a is completely dried, the shut-off valve 24g is closed to stop the supply of air K, and the cylinder 21b is driven to move the cleaning container 21 downwards. Then, when the cleaning container 21 reaches a position (which will be hereinafter referred to as a lower drying position) at which air K injected from the injection nozzle 24a of the gas injection pipe 24 can most uniformly contact the lower holding grooves 13a formed in the lower holding portion 13 of each of the holding members 11, the cylinder 21b is stopped to stop the downward movement of the cleaning container 21 (step H). Thereafter, the shut-off valve 24g is open to supply air K from the air supply source 24h to inject air K toward both sides of the lower holding portion 13 from the injection nozzle 24a of the gas injection pipe 24 to dry the lower holding portion 13 (step I, see FIG. 12(b)). Furthermore, the supply of air K may be stopped once after the upper holding grooves 12a are cleaned as mentioned above, or the cleaning container 21 may be moved downwards to the lower drying position while supplying air K.

At this time, the driving means (not shown) connected to the shaft portion 15 of the holding member 11 is driven to reciprocate the wafer transport chuck 10 in longitudinal directions of the holding member 11 (step I). Thus, air K can uniformly contact all of the lower holding grooves 13a, so that it is possible to further improve drying efficiency and to reduce drying time.

Figure 13:
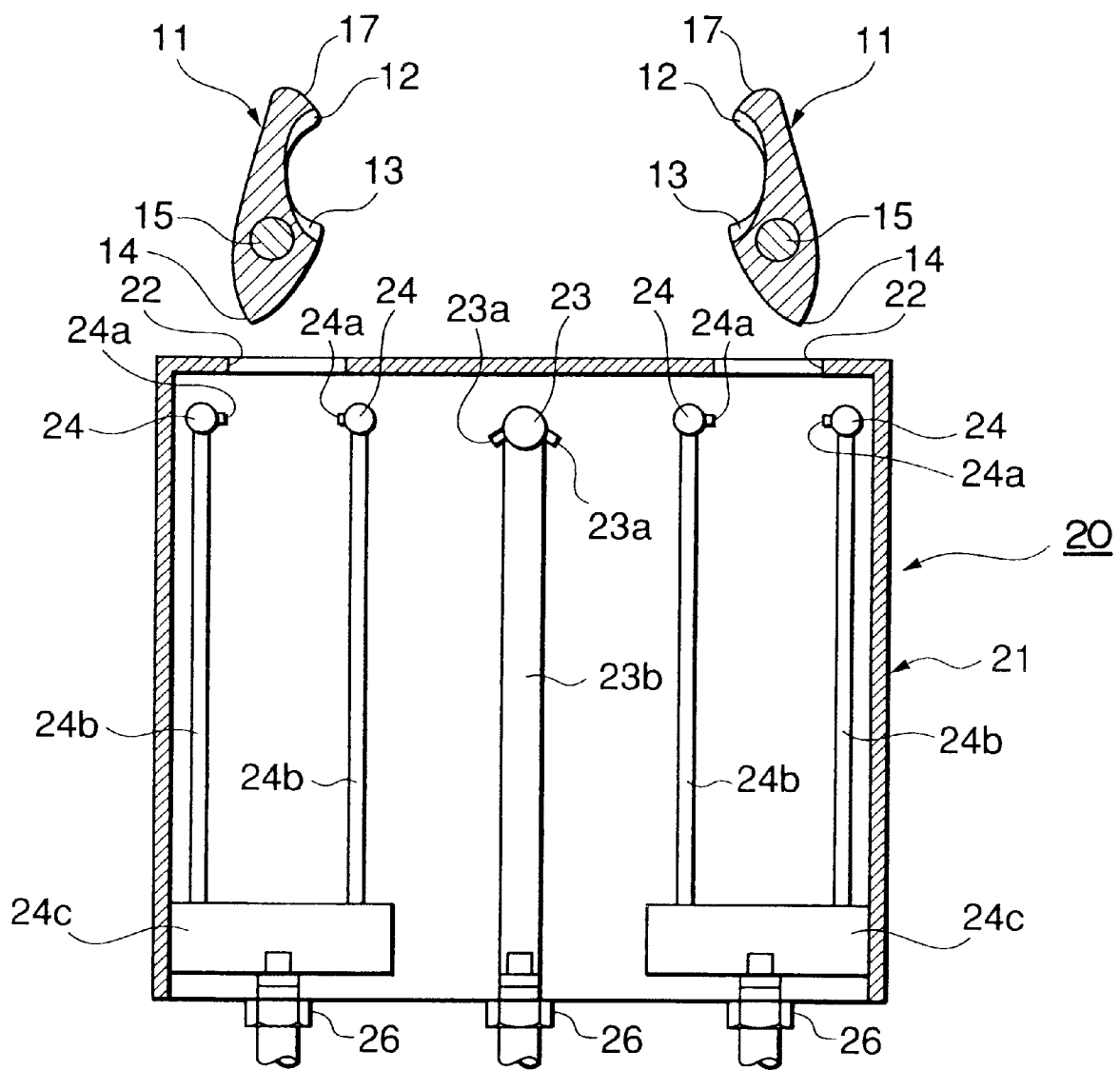
FIG. 13 is a schematic sectional view showing a step of taking a wafer transport chuck out of a cleaning container according to the present invention.
Figure 14:
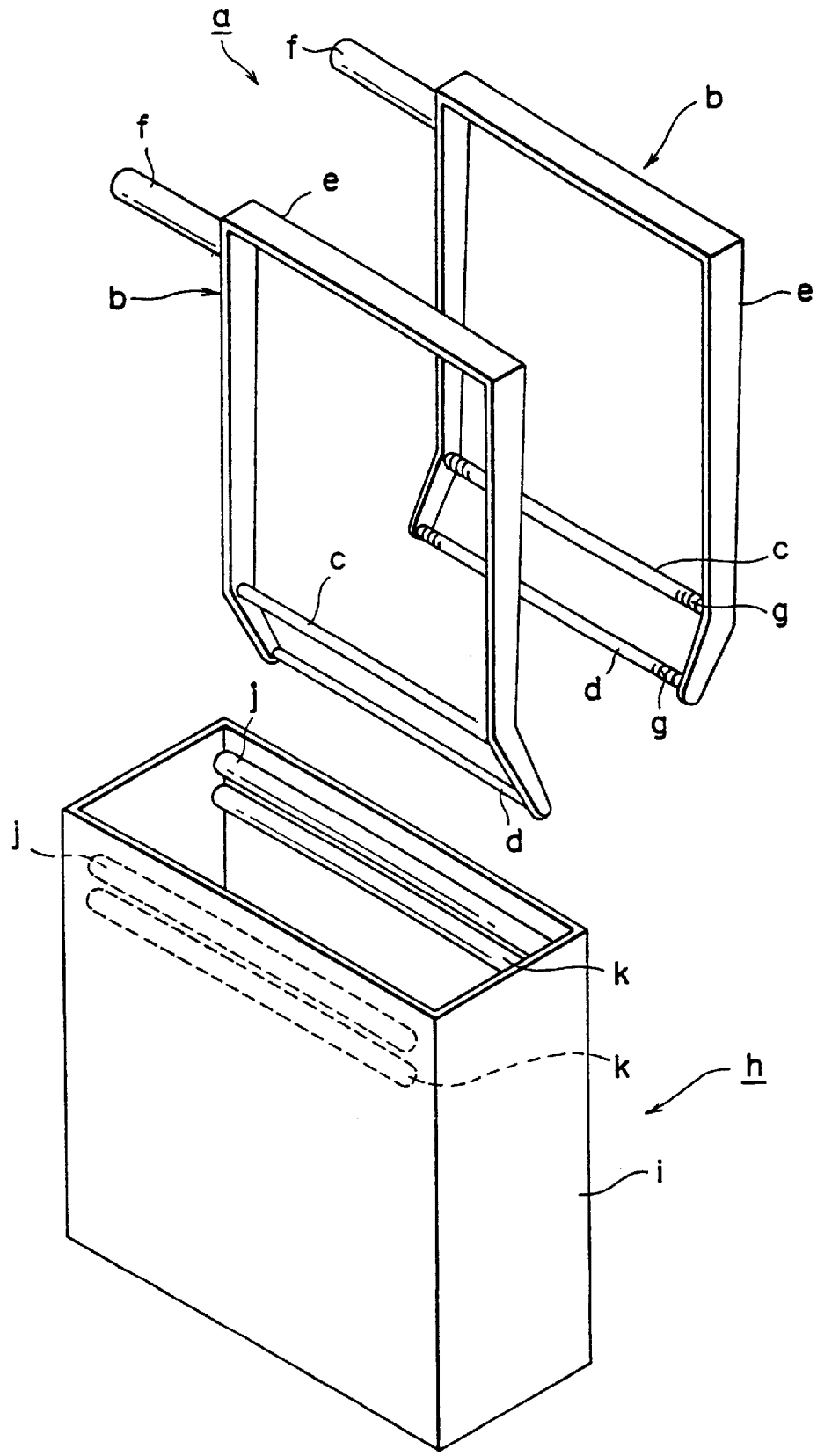
FIG. 14 is a schematic perspective view of an example of a conventional substrate holder and a system for cleaning and drying the substrate holder.

After the lower holding grooves 13a is completely dried, the shut-off valve 24g is closed to stop the supply of air K, and the cylinder 21b is driven to move the cleaning container 21 downwards to return the cleaning container 21 to the original position (step J, see FIG. 13). Thus, a series of steps of cleaning and drying the wafer transport chuck 10 are completed. Thereafter, the interface section 4 can receive the wafers W again to clean and dry the wafers W.

In the above described system and method for cleaning and drying the wafer transport chuck 10, while the cylinder 21b serving as the lifter means has been connected to the cleaning container 21 to move the cleaning container 21 in vertical directions, the present invention should not be limited thereto. If the lifter means can achieve the vertical relative movement between the wafer transport chuck 10 and the cleaning container 10, the lifter means may be, e.g., a ball screw mechanism, or a rack and pinion. The lifter means may be connected to the wafer transport chuck 10, not to the cleaning container 21.

In the above described drying step, while the driving means (not shown) for allowing the holding member 11 of the wafer transport chuck 10 to reciprocate in longitudinal direction has been connected to the shaft portion 15 of the wafer transport chuck 10, the present invention should not be limited thereto. For example, the driving means may be connected to the cleaning container 21, not to the shaft portion 15, since the cleaning container 21 and the wafer transport chuck 10 may reciprocate relatively in longitudinal direction to allow the dry gas, e.g., air K, to uniformly contact the upper or lower holding grooves 12a, 13a.

In the above described preferred embodiment, while the substrate holder and the system and method for cleaning and drying the substrate holder have been applied to the semiconductor wafer holder, they may be applied to a substrate other than the semiconductor wafer, e.g., a glass substrate for an LCD. In the above described preferred embodiments, while the above described system for cleaning and drying the substrate holder has been introduced into the system for cleaning and drying the semiconductor wafer to be used as a part of the system, the present invention should not be limited thereto, but the system may be used as a unit.

As described above, the present invention has the following excellent advantages.

(1) According to the substrate holder of the first invention, since the holding member is formed by a single member, it is possible to improve the strength of the substrate holder and to make the upper and lower holding portions smaller. Thus, since it is possible to make the holding grooves smaller, it is possible to reduce the quantity of the cleaning solution remaining in the holding grooves. In addition, since the upper and lower holding portions have a circular arc surface facing the held portion, it is possible to quickly drain the injected cleaning solution, and it is possible to allow the injected dry gas to quickly flow along one surface of the holding member, so that the dry gas can efficiently contact all of the holding grooves. Therefore, it is possible to reduce the drying time and to improve the throughput.

In this case, since the upper end portion of the holding member has a convex circular arc surface, it is possible to prevent the cleaning solution from remaining on the upper portion of the holding member, and it is possible to allow the dry gas to more quickly flow on the upper surface of the holding member. Therefore, the drying efficiency of the holding member can be further improved. In addition, if the draining portion is provided on the lower end portion of the holding member, it is possible to quickly remove the cleaning solution adhered to the surface of the substrate holder after cleaning the substrate holder. Since the holding member is provided with the shaft portion, it is possible to surely hold the substrate. Since the splash preventing plate is mounted on the shaft portion, it is possible to prevent the droplets of the cleaning solution from splashing to the outside during cleaning. Since the draining portions are provided on the splash preventing plate and the lower portion of the shaft portion, it is possible to quickly remove the cleaning solution adhered to the splash preventing plate and the shaft portion during and after cleaning the substrate holder. Since the shaft portion projects from the lower portion of one end of each of the holding members so as to extend in longitudinal directions, the holding members can easily rotate about the shaft portion to approach and leave another while the substrates are mounted in the holding grooves.

(2) According to the second invention, since the pair of openings are formed in the upper surface of the cleaning container, it is possible to simultaneously two holding members. Therefore, it is possible to reduce drying time and it is possible to improve throughput. In addition, since the vertical relative movement between the substrate holder and the cleaning container is allowed, the cleaning solution injected from the cleaning solution supply means can uniformly contact the upper and lower holding portions, and the dry gas injected from the dry gas supply means can uniformly contact the upper and lower holding portions. Therefore, it is possible to efficiently clean and dry the substrate holder.

In this case, if the cleaning solution supply means is provided between both of the openings, it is possible to inject the cleaning solution toward the holding members from one cleaning solution supply means. In addition, if the dry gas supply means are provided in the vicinity of both sides of each of the openings, the dry gas can be injected toward both sides of the holding member. Moreover, since the splash preventing plate projecting inwardly of the cleaning container is provided on the side surface of the opening, it is possible to prevent the droplets of the cleaning solution from splashing to the outside of the cleaning container during cleaning the substrate holder. In addition, since the substrate holder and the cleaning container can relatively reciprocate in longitudinal directions of the holding member, the substrate holder can move relatively to the dry gas supply means during injecting the dry gas, so that it is possible to uniformly inject the dry gas into the holding grooves arranged in the upper and lower holding portions and it is possible to improve drying efficiency.

(3) According to the third invention, since the dry gas is sequentially injected toward the upper and lower holding portions after the cleaning solution is sequentially injected toward the upper and lower holding portions, it is possible to efficiently clean and dry the upper and lower holding portions of the substrate holder. Therefore, it is possible to reduce drying time and it is possible to reduce the quantity of the cleaning solution and drying gas to be used. In this case, if the dry gas is injected onto the substrate holder and if the substrate holder and the cleaning container are relatively reciprocated in longitudinal directions of the holding member, it is possible to uniformly inject the dry gas into the respective holding grooves and it is possible to improve drying efficiency.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A substrate holder comprising a pair of holding members for holding a substrate wherein each of said pair of holding members has upper and lower holding portions projecting from upper and lower portions of a surface facing another holding member, respectively, and wherein each of said upper and lower holding portions has a circular arc surface facing a held portion of said substrate, and a plurality of aligned holding grooves, wherein each of said holding members has an upper end portion having a convex circular arc surface.

2. A substrate holder comprising a pair of holding members for holding a substrate, wherein each of said pair of holding members has upper and lower holding portions projecting from upper and lower portions of a surface facing another holding member, respectively, and wherein each of said upper and lower holding portions has a circular arc surface facing a held portion of said substrate, and a plurality of aligned holding grooves, wherein an acute draining portion projecting downwards is provided on a lower end portion of each of said holding members.

3. A substrate holder comprising a pair of holding members for holding a substrate, wherein each of said pair of holding members has upper and lower holding portions projecting from upper and lower portions of a surface facing another holding member, respectively, and wherein each of said upper and lower holding portions has a circular arc surface facing a held portion of said substrate, and a plurality of aligned holding grooves, wherein each of said holding members has a shaft portion projecting in longitudinal directions from one end of the corresponding one of said holding members, and a splash preventing plate mounted on said shaft portion in vicinity of the corresponding one of said holding members so as to cross said shaft portion.

4. A substrate holder as set forth in claim 3, wherein an acute draining portion projecting downwards is provided on a lower portion of said splash preventing plate.

5. A substrate holder as set forth in claim 3, wherein an acute draining portion projecting downwards is provided on a lower portion of said shaft portion.

6. A substrate holder as set forth in claim 3, wherein said shaft portion projects from a lower portion of one end of each of said holding members in longitudinal directions.

7. A substrate holder as set forth in claim 1, wherein said upper and lower holding portions are integrally formed so as to have said circular arc surface facing said held portion of said substrate and so as to have said plurality of aligned holding grooves.

8. A substrate holder as set forth in claim 2, wherein said upper and lower holding portions are integrally formed so as to have said circular arc surface facing said held portion of said substrate and so as to have said plurality of aligned holding grooves.

9. A substrate holder as set forth in claim 7, wherein said upper and lower holding portions are integrally formed so as to have said circular arc surface facing said held portion of said substrate and so as to have said plurality of aligned holding grooves.

10. A substrate holder comprising a pair of holding members for holding a substrate, wherein each of said pair of holding members has upper and lower holding portions projecting from upper and lower portions of a surface facing another holding member, respectively, wherein said upper and lower holding portions are integrally formed so as to have plurality of aligned holding grooves, wherein an acute draining portion projecting downwards is provided on a lower end portion of each of said holding members.

11. A substrate holder as set forth in claim 10, wherein each of said holding members has a shaft portion projecting from a lower portion of one end of each of said holding members in longitudinal directions.

\* \* \* \* \*